United States Patent
Abbott, Jr. et al.

(10) Patent No.: US 10,449,763 B2
(45) Date of Patent: Oct. 22, 2019

(54) AMORPHOUS THIN METAL FILM

(71) Applicants: HEWLETT-PACKARD DEVELOPMENT COMPANY, L.P., Houston, TX (US); The State of Oregon State Board of Higher Education on behalf of Oregon State University, Corvallis, OR (US)

(72) Inventors: James Elmer Abbott, Jr., Corvallis, OR (US); John M McGlone, Corvallis, OR (US); Kristopher Olsen, Corvallis, OR (US); Roberto A Pugliese, Tangent, OR (US); Greg Scott Long, Corvallis, OR (US); Douglas A Keszler, Corvallis, OR (US); John Wager, Corvallis, OR (US)

(73) Assignees: HEWLETT-PACKARD DEVELOPMENT COMPANY, L.P., Spring, TX (US); Oregon State University, Corvallis, OR (US)

( * ) Notice: Subject to any disclaimer, the term of this patent is extended or adjusted under 35 U.S.C. 154(b) by 0 days.

(21) Appl. No.: 16/067,788

(22) PCT Filed: Jun. 24, 2016

(86) PCT No.: PCT/US2016/039204
§ 371 (c)(1),
(2) Date: Jul. 2, 2018

(87) PCT Pub. No.: WO2017/222551
PCT Pub. Date: Dec. 28, 2017

(65) Prior Publication Data
US 2019/0100007 A1    Apr. 4, 2019

(51) Int. Cl.
*B41J 2/14* (2006.01)
*C23C 14/00* (2006.01)
(Continued)

(52) U.S. Cl.
CPC ......... *B41J 2/14129* (2013.01); *B41J 2/1606* (2013.01); *B41J 2/1646* (2013.01);
(Continued)

(58) Field of Classification Search
CPC .... B41J 2/14129; B41J 2/1646; B41J 2/1606; B41J 2202/03; C23C 14/0036;
(Continued)

(56) References Cited

U.S. PATENT DOCUMENTS

| 5,448,273 A | 9/1995 | Klein et al. |
| 6,906,735 B2 | 6/2005 | Bhatt et al. |

(Continued)

FOREIGN PATENT DOCUMENTS

| WO | WO-0069635 | 11/2000 |
| WO | WO-2015005931 | 1/2015 |

*Primary Examiner* — Geoffrey S Mruk
(74) *Attorney, Agent, or Firm* — HP Inc. Patent Department

(57) ABSTRACT

An amorphous thin metal film can include a combination of metals or metalloids including: 5 at % to 74 at % of a metalloid selected from the group of carbon, silicon, and boron; 5 at % to 74 at % of a first metal; 5 at % to 74 at % of a second metal; and 5 at % to 70 at % of a dopant. The first and second metals can be independently selected from the group of titanium, vanadium, chromium, iron, cobalt, nickel, zirconium, niobium, molybdenum, ruthenium, rhodium, palladium, hafnium, tantalum, tungsten, osmium, iridium, or platinum, wherein the first metal and the second metal can be different metals. The dopant can be selected from the group of oxygen, nitrogen, or combinations thereof. The metalloid, first metal, second metal, and dopant can account for at least 70 at % of the amorphous thin metal film.

15 Claims, 5 Drawing Sheets

(51) Int. Cl.
*H01B 1/02* (2006.01)
*B41J 2/16* (2006.01)
*C22C 45/00* (2006.01)
*C23C 14/08* (2006.01)
*C23C 14/18* (2006.01)
*C23C 28/04* (2006.01)

(52) U.S. Cl.
CPC .......... *C22C 45/00* (2013.01); *C23C 14/0036* (2013.01); *C23C 14/08* (2013.01); *C23C 14/185* (2013.01); *C23C 28/04* (2013.01); *B41J 2202/03* (2013.01); *H01B 1/02* (2013.01)

(58) Field of Classification Search
CPC ....... C23C 28/04; C23C 14/08; C23C 14/185; C22C 45/00; H01B 1/02
See application file for complete search history.

(56) References Cited

U.S. PATENT DOCUMENTS

| | | | |
|---|---|---|---|
| 6,926,390 B2 | 8/2005 | Fartash | |
| 8,567,909 B2 | 10/2013 | Sieber | |
| 2002/0033750 A1 | 3/2002 | Oizumi et al. | |
| 2016/0075136 A1 | 3/2016 | Abbott, Jr. et al. | |
| 2016/0114584 A1 | 4/2016 | Abbott, Jr. et al. | |
| 2018/0001636 A1* | 1/2018 | Chen | B41J 2/14129 |

* cited by examiner

AMORPHOUS THIN METAL FILM

BACKGROUND

Thin metal films can be used in various applications such as electronic semiconductor devices, optical coatings, and printing technologies. As such, once deposited, thin metal films can be subjected to harsh environments. For example, such thin films may be subjected to high heat, corrosive chemicals, etc.

In a typical inkjet printing system, an inkjet printhead ejects fluid (e.g., ink) droplets through a plurality of nozzles toward a print medium, such as a sheet of paper or other substrate, to print an image onto the print medium. The nozzles are generally arranged in one or more arrays or patterns, such that properly sequenced ejection of ink from the nozzles causes characters or other images to be printed on the print medium as the printhead and the print medium are moved relative to one another.

Because the ejection process is repeated thousands of times per second during printing, collapsing vapor bubbles can contribute to an adverse effect of damaging the heating element. The repeated collapsing of the vapor bubbles leads to cavitation damage to the surface material that coats the heating element. Each of these collapse events can thus contribute to ablation of the coating material. Once ink penetrates the surface material coating the heating element and contacts the hot, high voltage resistor surface, rapid corrosion and physical destruction of the resistor soon follows, rendering the heating element ineffective. There are also other examples of systems, outside of the inkjet arts, where structures may undergo contact with harsh environments. As such, research and development continues in the area of thin metal films used in various applications that can provide improved performance.

BRIEF DESCRIPTION OF THE DRAWINGS

Additional features and advantages of the present technology will be apparent from the detailed description which follows, taken in conjunction with the accompanying drawings, which together illustrate, by way of example, features of the present technology.

Figure 1:
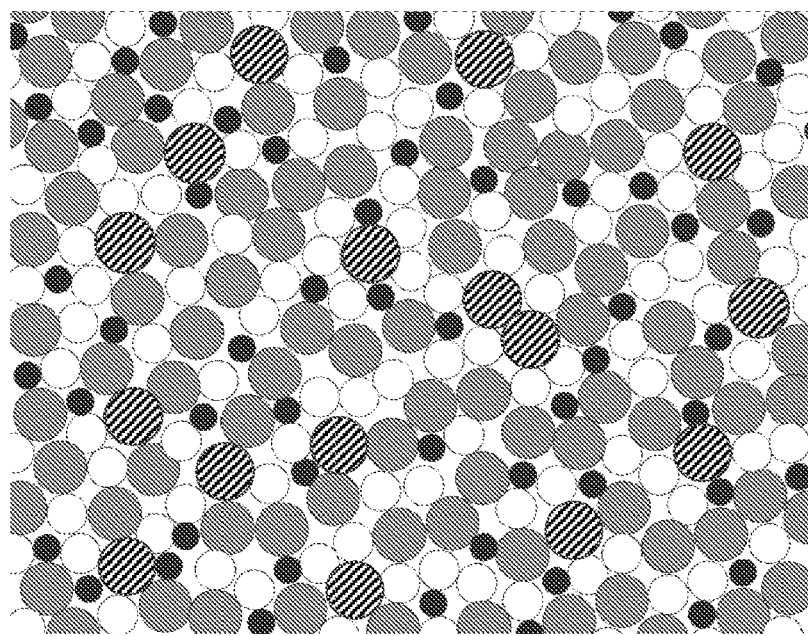
FIG. 1 shows an example schematic cross-sectional view of a distribution of elements of an amorphous thin metal film in accordance with an example of the present disclosure.

Reference will now be made to specific examples illustrated, and specific language will be used herein to describe the same. It will nevertheless be understood that no limitation of the scope of the present technology is thereby intended.

DETAILED DESCRIPTION

Amorphous thin metal films that can be stable having robust chemical, thermal, and mechanical properties are disclosed. As many thin films have a crystalline structure that possesses grain boundaries and a rough surface, there are certain films disclosed herein that can be more robust and which are amorphous in character. Grain boundaries and rough surfaces can hamper the thin metal film's chemical, thermal, and mechanical properties. Thus, in accordance with the present disclosure, thin metal films can be made from a multi-component system, such as a four (or even five or six) component system, providing a stable and amorphous structure having superior chemical, thermal, and mechanical properties.

In accordance with this, the present disclosure is drawn to an amorphous thin metal film including a combination of a plurality of components or elements. It is noted that when discussing an amorphous thin metal film, a method of manufacturing an amorphous thin metal film, or a thermal inkjet printhead stack with an amorphous thin metal resistor, each of these discussions can be considered applicable to each of these examples, whether or not they are explicitly discussed in the context of that particular example. Thus, for example, in discussing a metalloid for an amorphous thin metal film, such a metalloid can also be used in a method of manufacturing an amorphous thin metal film or a thermal inkjet printhead stack with an amorphous thin metal resistor, and vice versa.

As such, with the present discussion in mind, an amorphous thin metal film can include a combination of a plurality of elements including: 5 at % (atomic %) to 74 at % of a metalloid that can be carbon, silicon, or boron; 5 at % to 74 at % of a first metal that can be titanium, vanadium, chromium, iron, cobalt, nickel, zirconium, niobium, molybdenum, ruthenium, rhodium, palladium, hafnium, tantalum, tungsten, osmium, iridium, or platinum; 5 at % to 74 at % of a second metal that can be titanium, vanadium, chromium, iron, cobalt, nickel, zirconium, niobium, molybdenum, ruthenium, rhodium, palladium, hafnium, tantalum, tungsten, osmium, iridium, or platinum; and 16 at % to 70 at % of a dopant that can be nitrogen, oxygen, or mixtures thereof. The first metal can be different than the second metal. Generally, the metalloid, first metal, second metal, and the dopant can account for at least 70 at % of the amorphous thin metal film. In one example, three of the elements can account for at least 70 at % of the amorphous thin metal film. In one example, two elements can account for at least 70 at % of the amorphous thin metal film, and in another example, one element can account for at least 70 at % of the amorphous thin metal film. This range of metalloid, first metal, second metal, and dopant can likewise be independently modified at the lower end to 10 at %, or 20 at %, and/or at the upper end to 40 at %, 50 at %, 60 at %, or 70 at %. Furthermore, in one example, the metalloid, the first metal, the second metal, and the dopant can account for at least 80 at %, at least 90 at %, or even 100 at % of the amorphous thin metal film.

The present mixture of elements can be mixed in a manner and in quantities such that the mixture is homogenous. Additionally, the mixture can be applied to a suitable substrate using deposition techniques. Generally, the resulting thin metal film is amorphous. By using four or more components (or five or more components, etc.) in high enough concentrations, a "confusion" of sizes and properties disfavors the formation of lattice structures that are more typical in single component or even two component systems. Selecting components with suitable size differentials can contribute to minimizing crystallization of the structure. For example, the amorphous thin metal film can have an atomic dispersity of at least 12% between two of the plurality of elements. In another aspect, the amorphous thin metal film can have an atomic dispersity of at least 12% between all of the plurality of elements, e.g., metalloid, first metal, second metal, and/or dopant. As used herein, "atomic dispersity" refers to the difference in size between the radii of two atoms. In one example, the atomic dispersity can be at least 15%, and in one aspect, can be at least 20%. The atomic dispersity between components can contribute to the exceptional properties of the present films, including thermal stability, oxidative stability, chemical stability, resistivity, and surface roughness, which are not achieved by typical thin metal films. Oxidative stability can be measured by the amorphous thin metal film's oxidation temperature and/or oxide growth rate as discussed herein.

Figure 2:
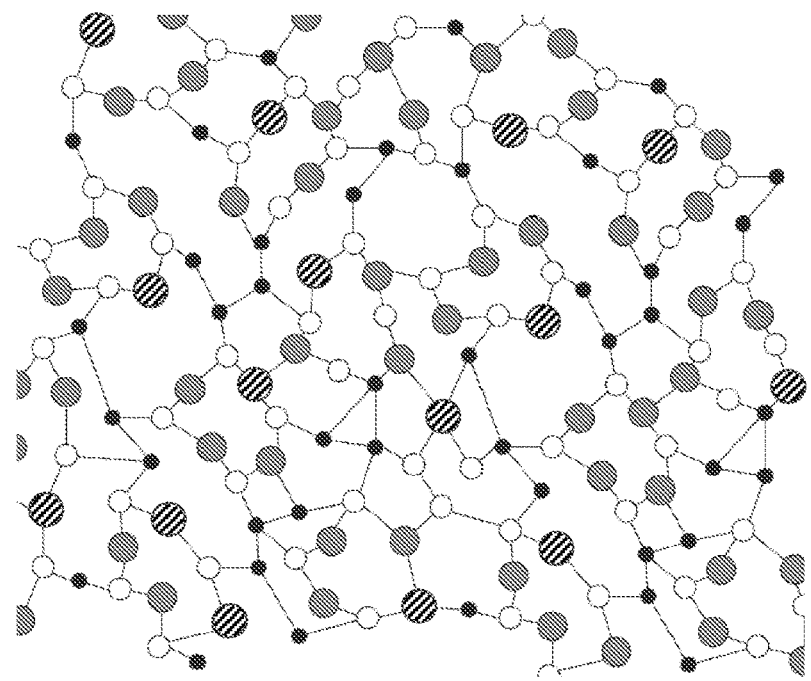
FIG. 2 shows an example of a lattice structure of an amorphous thin metal film in accordance with an example of the present disclosure.

Turning now to FIG. 1, the present thin metal films can have a distribution of components with an atomic dispersity as represented in FIG. 1. Notably, the present thin metal films can be generally amorphous with a smooth, grain-free structure. Likewise, the lattice structure of the present amorphous thin metal films can be represented by FIG. 2 as compared to typical films with a more crystalline lattice structure having grain boundaries.

As discussed herein, these amorphous thin metal films can have acceptable properties including thermal stability, oxidative stability, chemical stability, resistivity, and surface roughness. In one example, the present thin metal films can have a root mean square (RMS) roughness of less than 1 nm. In one aspect, the RMS roughness can be less than 0.5 nm. In another aspect, the RMS roughness can be less than 0.1 nm. One method to measure the RMS roughness includes measuring atomic force microscopy (AFM) over a 100 nm by 100 nm area. In other aspects, the AFM can be measured over a 10 nm by 10 nm area, a 50 nm by 50 nm area, or a 1 micron by 1 micron area. Other light scattering techniques can also be used such as x-ray reflectivity or spectroscopic ellipsometry.

In another example, the amorphous thin metal film can have a thermal stability of at least 700° C. In one aspect, the thermal stability can be at least 800° C. In another aspect, the thermal stability can be at least 900° C., or at least 1000° C. As used herein, "thermal stability" refers to the maximum temperature that the amorphous thin metal film can be heated while maintaining an amorphous structure. One method to measure the thermal stability includes sealing the amorphous thin metal film in a fused silica tube, heating the tube to a temperature, and using x-ray diffraction to evaluate the atomic structure and degree of atomic ordering.

In another example, the amorphous thin metal film can have an oxide growth rate of less than 0.05 nm/min. In one aspect, the oxide growth rate can be less than 0.04 nm/min, or in another aspect, less than 0.03 nm/min. One method to measure the oxide growth rate is to heat the amorphous thin metal film under air (20% oxygen) at a temperature of 300° C., measure the amount of oxidation on the amorphous thin metal film using spectroscopic ellipsometry periodically, and average the data to provide a nm/min rate.

Depending on the components and the method of manufacture, the amorphous thin metal film can have a wide range of electrical resistivity, including ranging from 800 μΩ·cm to 150,000 μΩ·cm. In some examples, the amorphous thin metal film can have a resistivity ranging from about 1000, 5000, 10,000, 10,100, 11,000, or 15,000 μΩ·cm to about 20,000, 40,000, 60,000, 80,000, 100,000, or 120,000 μΩ·cm. In one specific example, the amorphous thin metal film can have a bulk electrical resistivity of from 800 μΩ·cm to 10,000 μΩ·cm. or from 1000 μΩ·cm to 8,000 μΩ·cm, or from 2000 μΩ·cm to 6,000 μΩ·cm.

Generally, the amorphous thin metal film can have an exothermic heat of mixing. As discussed herein, the present thin metal films generally include a metalloid, a first metal, a second metal, and a dopant, where the first and second metals can include elements selected from Periodic Table Groups IV, V, VI, VII, VIII, IX, and X (4, 5, 6, 7, 8, 9, and 10).

Additionally, the amorphous thin metal films can further include a third metal, at an amount from about 2 at % to about 70 at %. In other examples, the third metal can be present in an amount from about 2 at %, 3 at %, 5 at %, or 10 at % to about 30 at %, 40 at %, 50 at %, or 60 at %. The third metal can also include elements selected from Periodic Table Groups IV, V, VI, VII, VIII, IX, and X (4, 5, 6, 7, 8, 9, and 10). In a more specific example, the third metal can include titanium, vanadium, chromium, iron, cobalt, nickel, zirconium, niobium, molybdenum, ruthenium, rhodium, palladium, hafnium, tantalum, tungsten, osmium, iridium, or platinum.

In one example, the amorphous thin metal films can include a refractory metal selected from the group of titanium, vanadium, chromium, zirconium, niobium, molybdenum, ruthenium, rhodium, hafnium, tantalum, tungsten, osmium, or iridium. In some examples, the first metal, the second metal, and/or the third metal, when present, can be a refractory metal, respectively. In one aspect, the first and/or second metal can be present in the thin film in an amount ranging from 20 at % to 74 at %. In another aspect, the first and/or second metal can be present in the thin film in an amount ranging from 20 at % to 60 at %.

The dopant can generally be present in the amorphous thin metal film in an amount ranging from about 15 at % or about 16 at % to 70 at %. In one example, the dopant can be present in an amount ranging from 20 at % to 60 at %. In yet other examples, the dopant can be present in an amount from about 25 at % to about 55 at %. Additionally, in one aspect, the amorphous thin metal film can be devoid of aluminum, silver, and gold.

Generally, the amorphous thin metal film can have a thickness ranging from 10 angstroms to 100 microns. In one example, the thickness can be from 10 angstroms to 2 microns. In one aspect, the thickness can be from 0.05 microns to 0.5 microns.

Turning now to a method of manufacturing an amorphous thin metal film, the method can include depositing a metalloid, a first metal, a second metal, and a dopant on a substrate to form the amorphous thin metal film. The thin metal film can include 5 at % to 74 at % of the metalloid selected from the group of carbon, silicon, and boron; 5 at % to 74 at % of the first metal selected from the group of titanium, vanadium, chromium, iron, cobalt, nickel, zirconium, niobium, molybdenum, ruthenium, rhodium, palladium, hafnium, tantalum, tungsten, osmium, iridium, or platinum; 5 at % to 74 at % of the second metal selected from the group of titanium, vanadium, chromium, iron, cobalt, nickel, zirconium, niobium, molybdenum, ruthenium, rhodium, palladium, hafnium, tantalum, tungsten, osmium, iridium, or platinum; and 16 at % to 70 at % of the dopant selected from the group of oxygen, nitrogen, and mixtures thereof, wherein the first metal and the second metal are different. In another example, prior to depositing, the metalloid, the first metal, and the second metal can be mixed to form a blend that can be subsequently deposited.

Generally, the step of depositing can include sputtering, atomic layer deposition, chemical vapor deposition, electron beam evaporation, ion beam deposition, or thermal evaporation. In one example, the depositing can be sputtering. The sputtering can generally be performed at from 1 mTorr to 20 mTorr or from 5 mTorr to 15 mTorr at a deposition rate of 5 to 10 nm/min with the target approximately 4 inches from a stationary substrate. Other deposition conditions may be used and other deposition rates can be achieved depending on variables such as target size, electrical power used, pressure, sputter gas, target to substrate spacing and a variety of other deposition system dependent variables.

Notably, amorphous thin metal films as discussed herein can have desired properties including thermal stability, oxidative stability, chemical stability, electrical resistivity, and surface roughness. As such, the present thin metal films can be used in a number of applications including electronic semiconductor devices, optical coatings, and printing technologies, for example.

In one specific example, the amorphous thin metal film can be used in a thermal inkjet printhead stack as a resistor. The resistor can be applied to an insulated substrate in the printhead stack. The resistor can include an amorphous layer of from 5 at % to 74 at % of a metalloid of carbon, silicon, or boron; from 5 at % to 74 at % of a first metal of titanium, vanadium, chromium, iron, cobalt, nickel, zirconium, niobium, molybdenum, ruthenium, rhodium, palladium, hafnium, tantalum, tungsten, osmium, iridium, or platinum; from 5 at % to 74 at % of a second metal of titanium, vanadium, chromium, iron, cobalt, nickel, zirconium, niobium, molybdenum, ruthenium, rhodium, palladium, hafnium, tantalum, tungsten, osmium, iridium, or platinum; and from 16 at % to 70 at % of a dopant of nitrogen, oxygen, or mixtures thereof. The second metal in this example can be different than the first metal. The metalloid, the first metal, the second metal, and the dopant can account for at least 70 at % of the amorphous thin metal film. Alternatively, two components of the metalloid, the first metal, the second metal, and the dopant can account for at least 70 at % of the amorphous thin metal film. In yet another example, the metalloid, the first metal, the second metal, and the dopant can account for at least 90 at %, or even 100 at % of the resistor. Furthermore, in each of the above ranges, e.g., for the metalloid, the first metal, and/or the second metal, the lower end of the range can be modified independently to 10 at %, 15 at %, or 20 at %. Likewise, the upper end of these ranges can be modified independently to 85 at %, 80 at %, or 70 at %.

In some examples, the amorphous layer can include from 2 at % to 70 at % of third metal of titanium, vanadium, chromium, iron, cobalt, nickel, zirconium, niobium, molybdenum, ruthenium, rhodium, palladium, hafnium, tantalum, tungsten, osmium, iridium, or platinum. In other examples, the third metal can be present in an amount from about 2 at %, 3 at %, 5 at %, or 10 at % to about 30 at %, 40 at %, 50 at %, or 60 at %.

The thermal printhead stack can also include a pair of conductors electrically coupled with the resistor. In this example, the pair of conductors can also include passivation layers, respectively, applied to a top surface of the pair of conductors, but not to the resistor. In another example, though the resistor material can be resistant to the corrosive nature of many inkjet inks, in one example, an electrically insulating film can also be applied to the resistor. When both the conductors are coated with dielectric layers (passivation layers and electrically insulating film), a common passivation or electrically insulating film can be used, or separate material coating layers can be used.

In many thin film stacks, tantalum (Ta) is commonly used, such as for certain top coatings, as it is chemically resistant to many inks and also resists mechanical cavitation forces from bubble collapse. However, in most thin film applications, tantalum and other metals are deposited in a crystalline form. This leads to grain boundaries and an intrinsically rough surface. Oxide growth in crystalline materials typically follows these grain boundaries, and film consumption by oxidation is one major failure mode of inkjet resistor film stacks capped with crystalline metals. In addition, grain boundaries can promote crack propagation and limit mechanical robustness. Thus, amorphous metal films, such as those described herein, can be used that are very heat and chemical resistant, and thus, can be used without other protective coatings or with only thin insulating protective coatings. Thus, the typical tantalum top coating can be completely removed in some examples.

With respect to resistors per se, the materials of the present disclosure can provide a suitable substitute for tantalum and aluminum alloys, as they can be resistant to chemical attack by ink jet inks, and can be inherently mechanically resistant to fracture due to the lack of grain boundaries. These materials can be thermally stable in the temperature range typically used for thermal inkjet imaging with aqueous inkjet inks. Additionally, less energy may be used since the resistor can be formed and used without additional coatings, or with only a relatively thin dielectric coating as described previously. For example, in typical thermal inkjet ink systems, the stack might include a 2500 angstrom passivation layer and a 5000 angstrom tantalum layer. By removing the tantalum layer and reducing the thickness of the passivation layer (or eliminating it altogether, a significant reduction in the amount of energy required to eject an ink drop can be achieved. By reducing energy needed for firing, improvement in firing frequency can also be realized.

Figure 3:
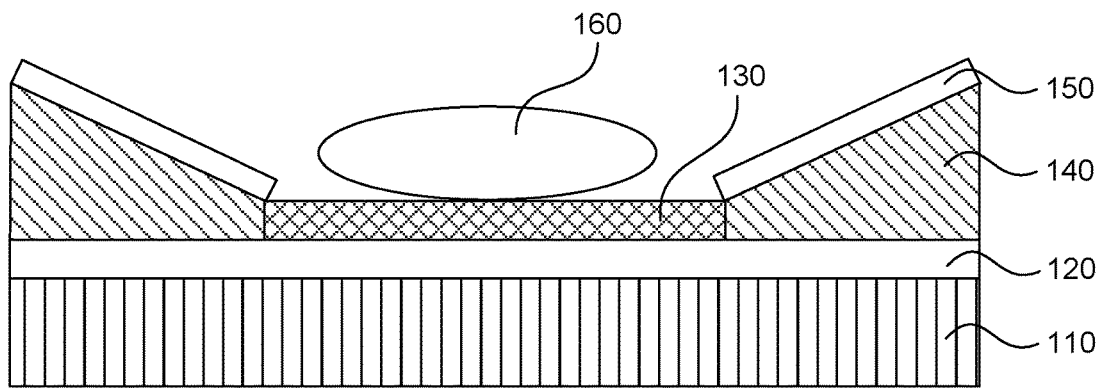
FIG. 3 shows an example cross-sectional schematic view of a portion of a thermal inkjet printhead stack in accordance with an example of the present disclosure.
Figure 4:
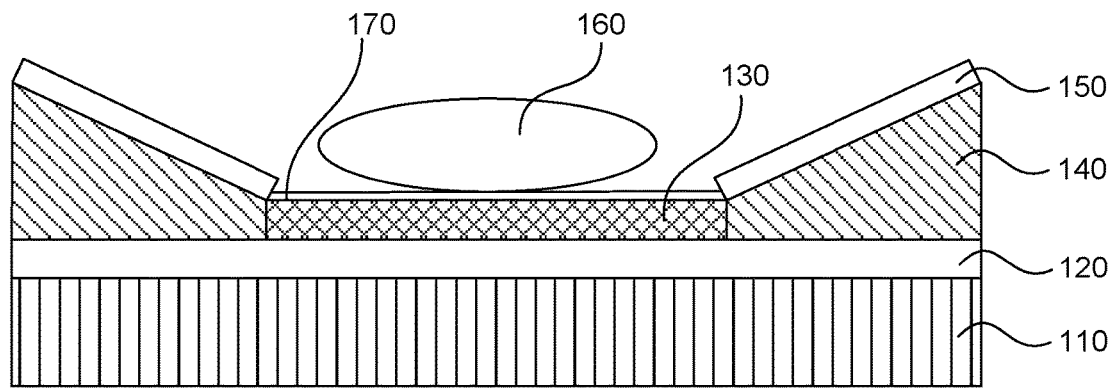
FIG. 4 shows an example cross-sectional schematic view of a portion of a thermal inkjet printhead stack in accordance with an alternative example of the present disclosure.
Figure 5:
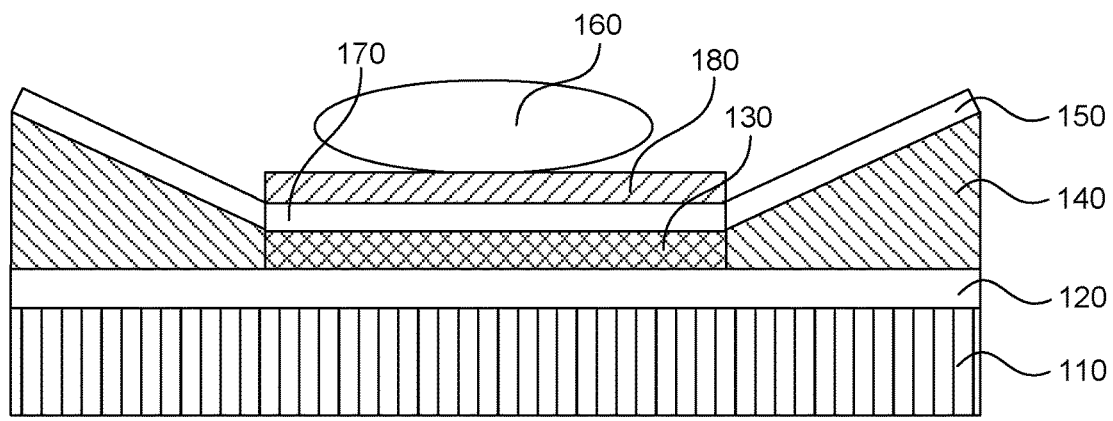
FIG. 5 shows an example cross-sectional schematic view of a portion of a thermal inkjet printhead stack in accordance with an alternative example of the present disclosure.

Turning now to FIGS. 3-5, three example structures are shown that can be suitable for a thin film stack for use in a thermal inkjet printhead. Specifically, a silicon wafer 110 is shown having an electrical insulating layer 120 applied thereto. In this example, the silicon wafer with the electrical insulating layer make up the "insulated substrate" described herein, as the surface is insulated from the semi-conductive silicon substrate. Thus, the term "insulated substrate" means that the surface of the substrate where the resistor is applied is insulating. That being stated, any substrate that is insulating can be used of any arrangement known in the art. A suitable average thickness for the electrical insulating layer can be from 0.5 microns to 2 microns.

To the insulating layer 120 is applied the resistor 130, which can be amorphous. Any of the materials described herein that include a metalloid (Si, C, or B), two or more metals of Groups IV, V, VI, VII, VIII, IX, and X, and a dopant of nitrogen and/or oxygen can be selected for use for the resistor. A suitable average thickness for the resistor can be from 0.02 microns to 0.3 microns, though thicknesses outside of this range can also be used. The resistor can likewise be in electrical communication with a pair of conductors 140 positioned on either side of the resistor. These conductors can act as electrodes for the resistor. In this example, the conductors are also applied to the insulating layer, though this arrangement is merely exemplary. The conductors can be of any material known in the art, but in one example, the conductors can be aluminum, or an alloy of aluminum and copper.

Furthermore, passivation layers 150, which are also insulating, are applied to the conductors to prevent contact between the ink 160 and the conductors. A suitable average thickness for the conductors can be from 0.1 microns to 2 microns, for example, and a suitable average thickness for the passivation layers can be from 0.05 microns to 1 micron. Again, thicknesses outside of these ranges can also be used in some examples. In some examples, though the resistor 130 can be highly effective with respect to its ink-resistive and heat stability properties, an electrical insulating film 170 can likewise be applied to the resistor, such is shown in FIGS. 4 and 5. This film can be relatively thin to relatively thick, e.g., from 50 angstroms to 1 micron, from 50 angstroms to 5000 angstroms, from 50 angstroms to 2500 angstroms, from 100 angstroms to 1000 angstroms, from 100 angstroms to 500 angstroms, from 100 angstroms to 200 angstroms, etc. Even at 2500 angstroms, many state of the art systems often use somewhere on the order of 5000 angstroms of tantalum and other coatings over as a topmost layer or layers to prevent chemical deterioration, and thus, the ability to use an insulating coating that reduces the thickness compared to typical dielectric coating thickness is an advancement in the art. That being stated, as shown in FIG. 5, a top metallic coating 180 can also be used as is typical in this field, with the new resistor materials described herein to provide an improved effect compared to state of the art resistors.

Insulating materials that can be used for the electrical insulating layer 120, the passivation layers 150, the thin electrical insulating film 170, or any other insulating layer can be SiN, $SiO_2$, $HfO_2$, $ZrO_2$, $Al_2O_3$, or other commonly used dielectric materials. The thin electrical insulating film, for example, can be formed by thermal oxidation of the amorphous metal film or deposition of an electrically insulating thin film. Also, it is noted that the thin electrical insulating film can be integrated with or of the same material as the passivation layers 150. Other layers can also be used as would be appreciated by one skilled in the art after considering the present disclosure.

It is noted that, as used in this specification and the appended claims, the singular forms "a," "an," and "the" include plural referents unless the context clearly dictates otherwise.

As used herein, "devoid of" refers to the absence of materials in quantities other than trace amounts, such as impurities.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 5 at % to about 74 at %" should be interpreted to include not only the explicitly recited values of about 5 at % to about 74 at %, but also include individual values and sub-ranges within the indicated range. Thus, included in this numerical range are individual values such as 6, 7.5, and 8, etc. and sub-ranges such as from 5-60, from 7-65, and from 9-70, etc. This same principle applies to ranges reciting only one numerical value. Furthermore, such an interpretation should apply regardless of the breadth of the range or the characteristics being described.

EXAMPLES

The following illustrate specific examples of the disclosure that are presently known. Thus, these examples should not be considered as limitations of the present technology, but are merely in place to teach how to make compositions of the present disclosure. As such, a representative number of compositions and their methods of manufacture are disclosed herein.

Example 1—Effect of Oxygen on Resistivity of Thin Films

Figure 6A:
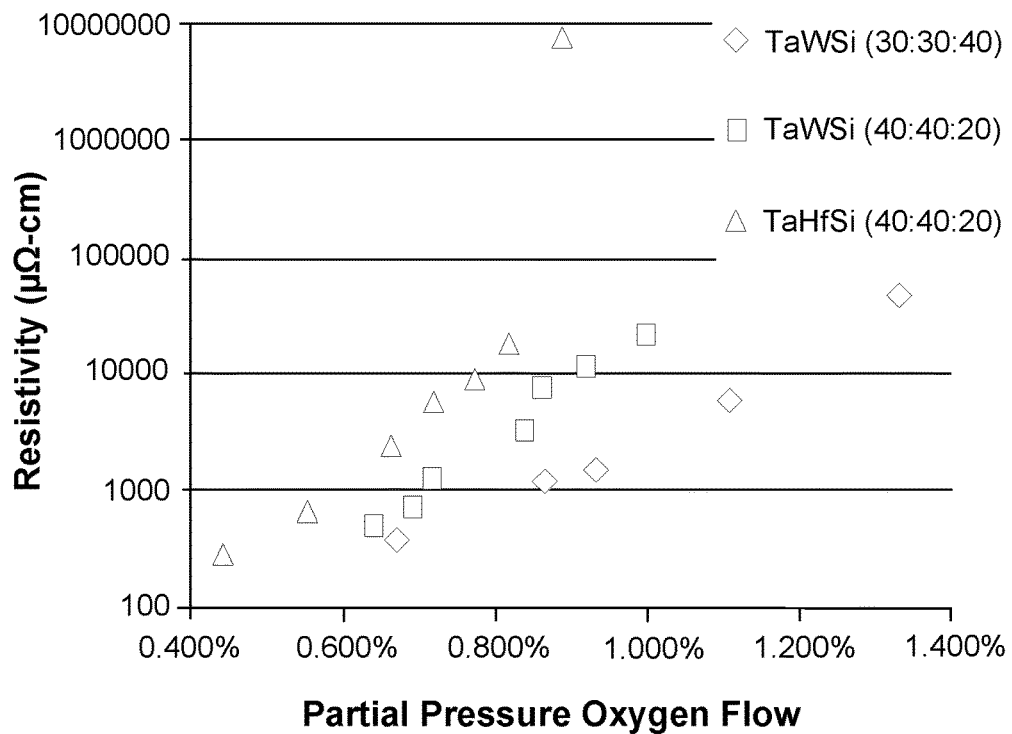
FIG. 6A illustrates an example graph correlating the effect of oxygen on the resistivity of some example materials in accordance with examples of the present disclosure.
Figure 6B:
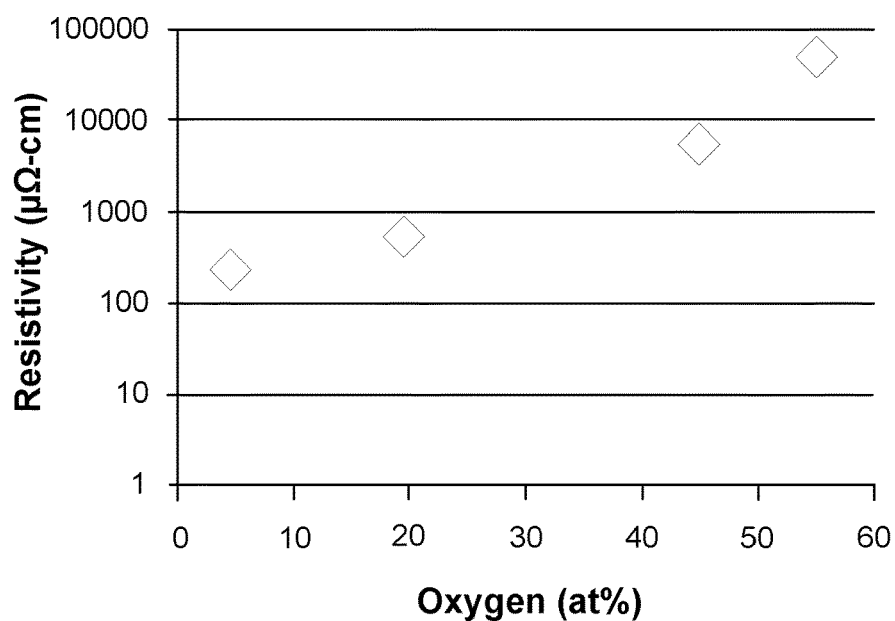
FIG. 6B illustrates an example graph correlating the effect of different atomic percentages of oxygen to the resistivity of an exemplary material in accordance with examples of the present disclosure.

Three separate example amorphous thin metal films were deposited via sputtering at different partial oxygen pressures, but otherwise having 30 at % tantalum, 30 at % tungsten, and 40 at % silicon; 40 at % tantalum, 40 at % tungsten, and 20 at % silicon; and 40 at % tantalum, 40 at % hafnium, and 20 at % silicon, respectively. More specifically, the films were deposited between 5 mTorr and 10 mTorr with a partial oxygen pressure flow of from approximately 0.4% to 1.25%. The TaHfSi amorphous thin film was RF sputtered, but the other films were DC sputtered. As can be seen in FIG. 6A, the amount of oxygen doped into the amorphous thin metal films can affect the bulk resistivity of the films. This is further illustrated in FIG. 6B, which shows an example SiTaW film having different atomic percentages of oxygen. As illustrated, the atomic percentage of oxygen in the example film can affect the resistivity of the film.

Figure 7:
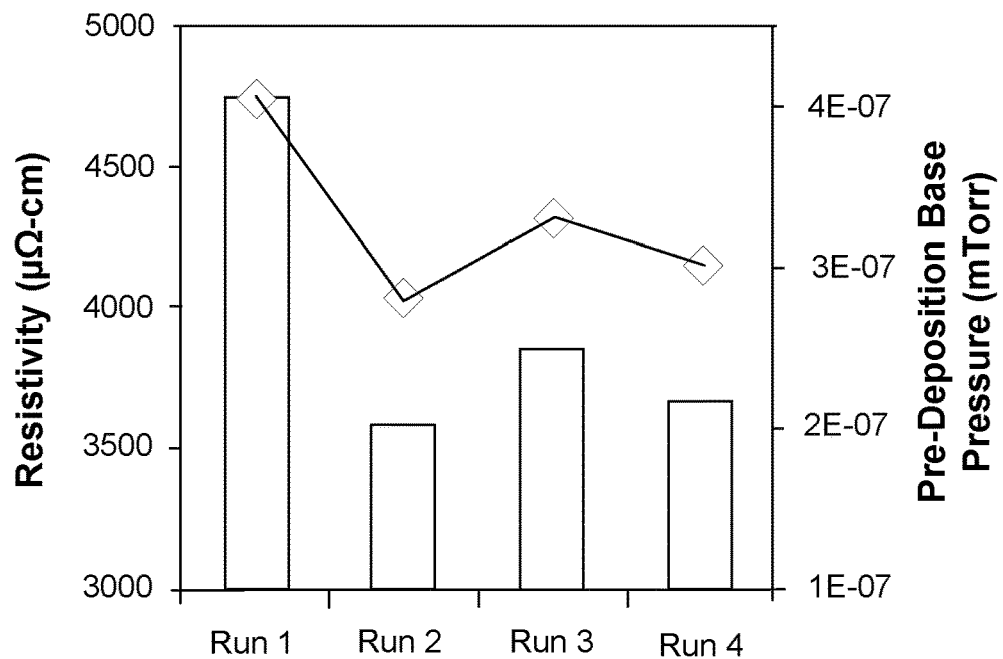
FIG. 7 illustrates an example graph correlating the effect of pre-deposition pressure on the resistivity of an example material in accordance with examples of the present disclosure.

It was also observed that the resistivity of various films can be additionally affected based on processing conditions. For example, FIG. 7 illustrates the difference in resistivity (represented by the bars) of example SiTaW films being sputter deposited from different pre-deposition base pressures (represented by diamonds). In this particular example, the amorphous thin films were DC sputter deposited from a 2 inch target at a partial oxygen pressure of 1.11%. Runs 1 and 2 were performed back to back. Runs 3 and 4 were deposited 1 day later.

Example 2—Stability of Thin Films

Figure 8:
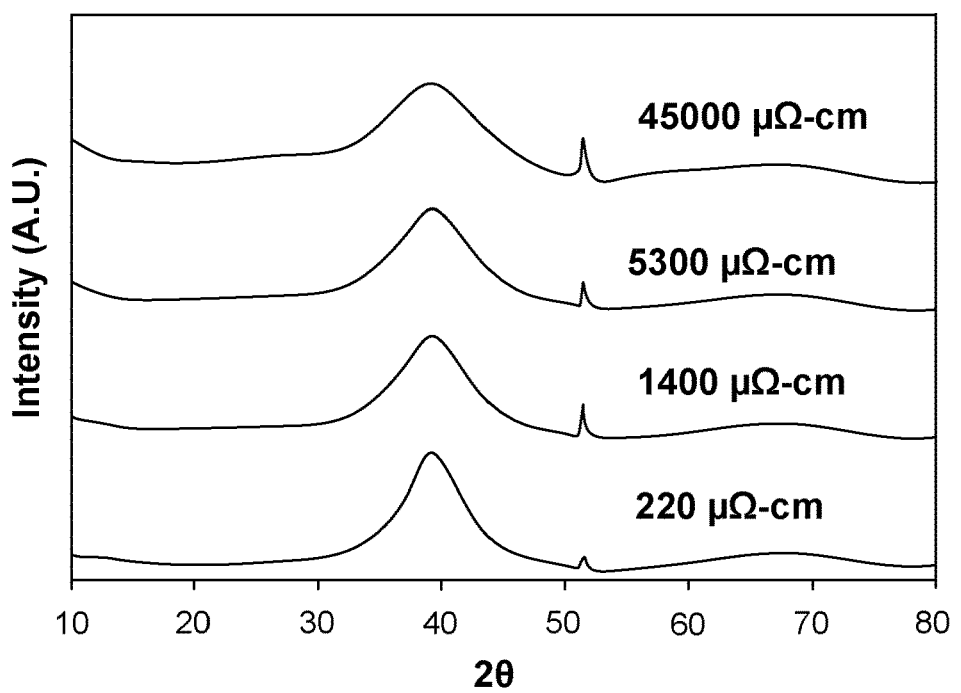
FIG. 8 illustrates stacked example x-ray diffraction patterns for example materials having different bulk resistivities in accordance with examples of the present disclosure.

Various example amorphous thin films were sputter deposited at different partial oxygen pressures according to the methods described in Example 1 to produce thin films having different atomic percentages of oxygen. Accordingly, each material had a different bulk resistivity. Each material was then evaluated using x-ray diffraction to determine the effect of increasing oxygen content on the amorphous structure of the thin films. As can be seen in FIG. 8, comparative stacked plots of the x-ray diffraction patterns for each of the example thin films illustrates that each of the thin films remained amorphous despite increasing oxygen content in the respective films.

Figure 9A:
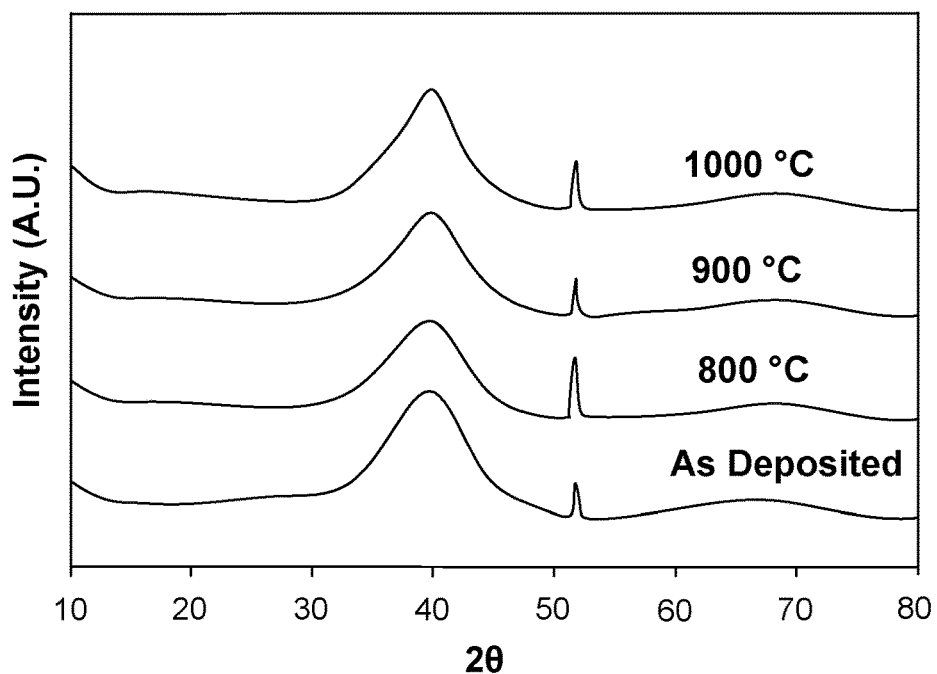
FIG. 9A illustrates stacked example x-ray diffraction patterns for an example material at different temperatures in accordance with examples of the present disclosure.
Figure 9B:
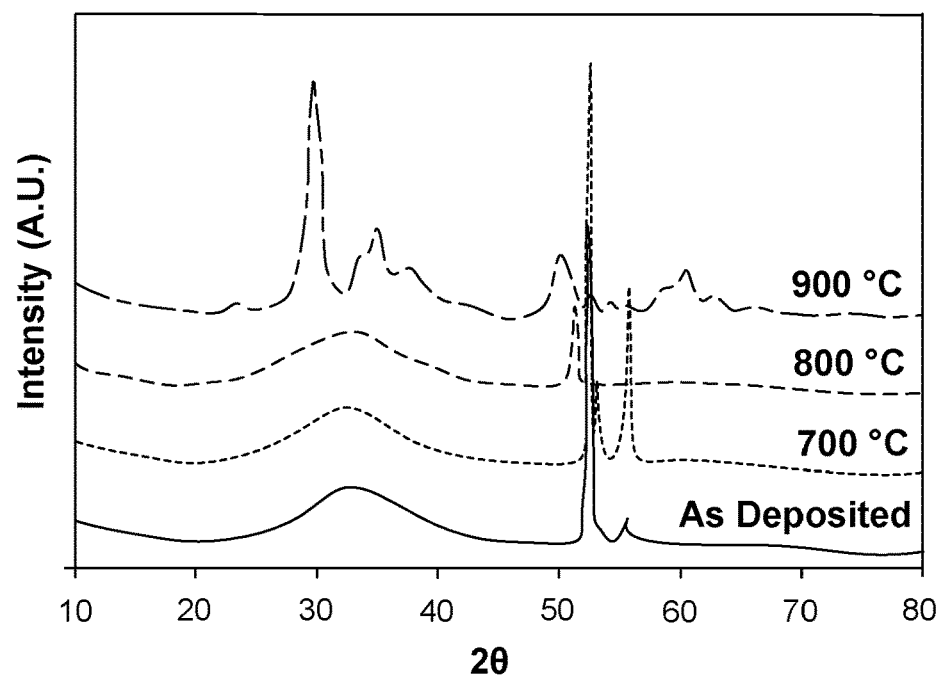
FIG. 9B illustrates stacked example x-ray diffraction patterns for another example material at different temperatures in accordance with examples of the present disclosure.

Further, example thin films were tested for thermal stability. Accordingly, various example amorphous thin films were placed into evacuated sealed tubes and heated in a furnace at different temperatures for approximately 60 minutes. Samples were then cooled and subsequently removed from their respective tubes for analysis by x-ray diffraction to determine whether the thin films would remain amorphous even at elevated temperatures. Two representative examples are illustrated in FIGS. 9A and 9B, each of which includes comparative stacked plots of x-ray diffraction patterns for the different materials at different temperatures. As can be seen in these figures, the SiTaW—O$_2$ film having a bulk resistivity of 5300 μΩ·cm and the TaHfSi—O$_2$ film having a bulk resistivity of 6215 μΩ·cm each remained thermally stable even at elevated temperatures.

Chemical stability of example amorphous thin films was also tested. Exemplary amorphous thin films of 40:40:20 TaWSi—O$_2$ and 40:30:30 SiTaW—O$_2$ were prepared according to methods and materials described herein and compared to a traditional WSiN thin film to determine any change in resistivity of the various materials after storage in a black Ink for four days. As can be seen from Table 1 below, the resistivity of the two amorphous thin films were substantially unaffected, whereas the resistivity of the WSiN was greatly affected.

TABLE 1

Change in resistivity after 4 days in Black Ink

| Material | Change in Resistivity after 4 days in Black Ink |
|---|---|
| TaWSi—O 4k | 0.20% |
| SiTaW—O 4k | 0.80% |
| WSiN | Too High to Measure |

While the present technology has been described with reference to certain examples, those skilled in the art will appreciate that various modifications, changes, omissions, and substitutions can be made without departing from the spirit of the present technology. It is intended, therefore, that the present technology be limited only by the scope of the following claims.

What is claimed is:

1. An amorphous thin metal film, comprising:
    5 at % to 74 at % of a metalloid, wherein the metalloid is carbon, silicon, or boron;
    5 at % to 74 at % of a first metal, wherein the first metal is titanium, vanadium, chromium, iron, cobalt, nickel, zirconium, niobium, molybdenum, ruthenium, rhodium, palladium, hafnium, tantalum, tungsten, osmium, iridium, or platinum;
    5 at % to 74 at % of a second metal, wherein the second metal is titanium, vanadium, chromium, iron, cobalt, nickel, zirconium, niobium, molybdenum, ruthenium, rhodium, palladium, hafnium, tantalum, tungsten, osmium, iridium, or platinum, wherein the second metal is different than the first metal; and
    16 at % to 70 at % of a dopant of nitrogen, oxygen, or mixture thereof,
    wherein the metalloid, the first metal, the second metal, and the dopant account for at least 70 at % of the amorphous thin metal film.

2. The amorphous thin metal film of claim 1, wherein the amorphous thin metal film has a thickness ranging from 10 angstroms to 100 microns.

3. The amorphous thin metal film of claim 1, wherein the amorphous thin metal film is devoid of aluminum, silver, and gold.

4. The amorphous thin metal film of claim 1, wherein the dopant is present in an amount from 20 at % to 60 at %.

5. The amorphous thin metal film of claim 1, wherein the first metal, the second metal, or both are a refractory metal, the refractory metal being titanium, vanadium, chromium, zirconium, niobium, molybdenum, ruthenium, rhodium, hafnium, tantalum, tungsten, osmium, or iridium.

6. The amorphous thin metal film of claim 1, wherein the amorphous thin metal film has a surface RMS roughness of less than 1 nm.

7. The amorphous thin metal film of claim 1, wherein the amorphous thin metal film has a bulk resistivity of from 800 μΩ·cm to 150,000 μΩ·cm.

8. A method, comprising:
    depositing an amorphous thin metal film on a substrate, wherein the amorphous thin metal film, comprises:
        5 at % to 74 at % of a metalloid, wherein the metalloid is carbon, silicon, or boron;
        5 at % to 74 at % of a first metal, wherein the first metal is titanium, vanadium, chromium, iron, cobalt, nickel, zirconium, niobium, molybdenum, ruthenium, rhodium, palladium, hafnium, tantalum, tungsten, osmium, iridium, or platinum;
        5 at % to 74 at % of a second metal, wherein the second metal is titanium, vanadium, chromium, iron, cobalt, nickel, zirconium, niobium, molybdenum, ruthenium, rhodium, palladium, hafnium, tantalum, tungsten, osmium, iridium, or platinum, and wherein the second metal is different than the first metal; and
        16 at % to 70 at % of a dopant of nitrogen, oxygen, or mixture thereof.

9. The method of claim 8, wherein the depositing includes sputtering.

10. The method of claim 8, wherein prior to depositing, the metalloid, the first metal, and the second metal are mixed to form a blend.

11. A thermal inkjet printhead stack with an amorphous thin metal resistor, comprising:
    an insulated substrate;
    a resistor applied to the insulated substrate, the resistor comprising an amorphous thin metal film, comprising:
        5 at % to 74 at % of a metalloid, wherein the metalloid is carbon, silicon, or boron;
        5 at % to 74 at % of a first metal, wherein the first metal is titanium, vanadium, chromium, iron, cobalt, nickel, zirconium, niobium, molybdenum, ruthenium, rhodium, palladium, hafnium, tantalum, tungsten, osmium, iridium, or platinum;

5 at % to 74 at % of a second metal, wherein the second metal is titanium, vanadium, chromium, iron, cobalt, nickel, zirconium, niobium, molybdenum, ruthenium, rhodium, palladium, hafnium, tantalum, tungsten, osmium, iridium, or platinum, wherein the second metal is different than the first metal; and 16 at % to 70 at % of a dopant, the dopant being nitrogen, oxygen, or mixtures thereof, wherein the metalloid, the first metal, the second metal, and the dopant account for at least 70 at % of the amorphous thin metal film.

12. The thermal inkjet printhead stack of claim 11, wherein the amorphous layer further comprises from 5 at % to 70 at % of a third metal, wherein the third metal is titanium, vanadium, chromium, iron, cobalt, nickel, zirconium, niobium, molybdenum, ruthenium, rhodium, palladium, hafnium, tantalum, tungsten, osmium, iridium, or platinum, wherein the third metal is different than the first metal and the second metal.

13. The thermal inkjet printhead stack of claim 11, further comprising a pair of conductors electrically coupled with the resistor, the pair of conductors including passivation layers applied to a top surface of the pair of conductors, but not to the resistor.

14. The thermal inkjet printhead stack of claim 11, further comprising a thin electrical insulating film applied to the resistor.

15. The thermal inkjet printhead stack of claim 11, wherein the resistor has a bulk resistivity of from 800 $\mu\Omega\cdot$cm to 150,000 $\mu\Omega\cdot$cm.

* * * * *